United States Patent
Ding et al.

(10) Patent No.: US 8,854,003 B2
(45) Date of Patent: Oct. 7, 2014

(54) TECHNIQUE FOR RAPID BATTERY CAPACITY TESTING

(75) Inventors: Yi Ding, Canton, MI (US); Sonya G. Zanardelli, Rochester, MI (US); John M. Zwally, Royal Oak, MI (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 394 days.

(21) Appl. No.: 13/476,640

(22) Filed: May 21, 2012

(65) Prior Publication Data

US 2013/0307481 A1 Nov. 21, 2013

(51) Int. Cl.
  *H02J 7/00* (2006.01)

(52) U.S. Cl.
  USPC .......... 320/124; 320/125; 320/129; 320/130; 320/131; 320/135

(58) Field of Classification Search
  USPC .................. 320/124–125, 127, 129–131, 135
  See application file for complete search history.

(56) References Cited

U.S. PATENT DOCUMENTS

| | | | |
|---|---|---|---|
| 4,829,225 A | 5/1989 | Podrazhansky et al. | |
| 5,307,000 A | 4/1994 | Podrazhansky et al. | |
| 5,381,350 A | 1/1995 | Fiorina et al. | |
| 5,561,360 A | 10/1996 | Ayres et al. | |
| 5,932,991 A | 8/1999 | Ahuja et al. | |
| 6,094,033 A | 7/2000 | Ding et al. | |
| 6,127,804 A | 10/2000 | Oglesbee et al. | |
| 6,198,251 B1 | 3/2001 | Landon | |
| 6,229,285 B1 | 5/2001 | Ding | |
| 6,232,750 B1 | 5/2001 | Podrazhansky et al. | |
| 6,310,462 B1 | 10/2001 | Arai et al. | |
| 6,707,272 B1 | 3/2004 | Thandiwe | |
| 7,221,125 B2 | 5/2007 | Ding | |
| 7,679,327 B2 | 3/2010 | Kim et al. | |
| 2009/0072788 A1* | 3/2009 | Delaille et al. | ................ 320/124 |

OTHER PUBLICATIONS

G.Ning, B.Haran, B.N.Popov, Capacity fade study of lithium-ion batteries cycled at high dishcarge rates, Elsevier Science B.V., Journal of Power Sources 117 (2003) 160-169.
J.Kim,S.Lee,B.Cho, The State of Charge Est. Employing Empirical Parameters Measurements for Various Temp., Seoul Nat'l Univ./Depart. of Electrical Engineering,151-744, Korea.
Battery & Energy Technologies, Battery Testing: Test Methods and Procedures, Electropaedia, http://www.mpoweruk.com/testing.htm, p. 1-5.

(Continued)

*Primary Examiner* — Paul Dinh
(74) *Attorney, Agent, or Firm* — David L. Kuhn; Thomas W. Saur; Luis Miguel Acosta

(57) ABSTRACT

A method of rapidly testing the discharge capacity of a battery comprises discharging the battery at a first discharge rate until a first cutoff potential is reached, relaxing the battery during a first period, discharging the battery at a lower discharge rate until a second cutoff potential is reached and relaxing the battery during a second, longer period. The process is repeated with successively lower discharge rates and successively longer relaxation periods until the battery is substantially exhausted. The cumulative value of all of the discharges is taken as a tested capacity of the battery. Optionally, cleanup charges can be sent to the battery during the relaxation periods and a low-frequency, low-amplitude current can be supplied throughout testing in order to shorten testing time.

15 Claims, 2 Drawing Sheets

(56) References Cited

OTHER PUBLICATIONS

V.Pop, et al., Modeling Battery Behavior for Accurate State-of-Charge Indication, Journal of the Electrochemical Society, 153 (11) A2013-A2022 (2006).

J.Li, E.Murphy, J.Winnick, P.Kohl, The effects of pulse charging on cycling characteristics of commercial lithium-ion batteries, Journal of Power Sources 102 (2001) 302-309.

V.Pop, et al., State-of-the-art of battery state-of-charge determination, 2005 Institute of Physics Publishing, Measurement Science & Technology, p. R93-R110.

Tom Hund, Battery Testing for Photovoltaic Applications, Photovoltaic System Applications Dept., Sandia National Laboratories, Albuquerque, NM, p. 1-13.

Doyle et al., A quick method of measuring the capacity versus discharge rate for a dual lithium-ion insertion cell undergoing cycling, Journal of Pwr Sources 52 (1994) 211-216.

\* cited by examiner

TECHNIQUE FOR RAPID BATTERY CAPACITY TESTING

GOVERNMENT INTEREST

The invention described here may be made, used and licensed by and for the U.S. Government for governmental purposes without paying royalty to us.

BACKGROUND OF THE INVENTION

1. Field of the Invention

The present invention generally relates to the testing of battery designs, and more particularly relates to tests which determine the full or residual charge capacity of a battery. The present invention is most relevant to those who seek a relatively rapid method to ascertain the total electrical energy of a new, modified or previously untested battery design. The present invention has some relation to the art of battery charging wherein the charge accepted by a battery is maximized by a relatively sophisticated charging regimen.

2. Background Art

One approach to battery capacity testing has been described by Doyle et al. in the article, "A Quick Method of Measuring the Capacity Versus Discharge Rate for a Dual Lithium-ion Insertion Cell Undergoing Cycling." The Doyle article focuses on finding the battery capacity as a function of discharge rate. It teaches successive discharges of a battery to a cutoff potential starting with the highest discharge rate followed by discharges at ever decreasing rates. The capacity obtained at a given discharge rate is assumed to correspond to cumulative battery capacity discharged up to that time. Each discharge is preceded by a brief relaxation period but is never preceded by a charging step. Doyle indicates (page 213, top of right column) that this method is relatively insensitive to length of relaxation periods.

In U.S. Pat. No. 5,381,350 to Fiorina et al., the backup time of a battery is estimated in an iterative manner by discharging the battery during successive estimated time intervals. During each of these intervals, an estimated discharge current in terms of actual discharge power, an estimated voltage, and an estimated state of charge are computed in accordance with a mathematical model equivalent to the battery. The backup time for the battery is equal to the sum of the estimated time intervals necessary for the estimated voltage to reach a preset threshold.

U.S. Pat. No. 6,232,750 B1 to Podrazhansky et al. shows a method to charge batteries wherein size of charge pulses, discharge pulses and relaxation periods depend on feedback obtained during the battery charging process. The charge and discharge pulses can vary in current, voltage, duration, frequency and number of applications. Relaxation periods can be varied by frequency or duration. Podrazhansky also uses short, isolated AC pulses to create a mixing of electrolytic reagents near the battery plates. Other isolated AC pulses, of a different frequency, are used in measuring the capacitance, condition or state of charge of the battery.

U.S. Pat. No. 5,307,000 to Podrazhansky et al. shows a method for rapidly thawing and charging a battery. This Podrazhansky patent uses variable charge pulses, discharge pulses and waiting periods whose values depend on certain parameters occurring as the battery thaws and becomes charged. The duration, number, and magnitude of the charging pulses are controlled so as to maintain the electrolyte's temperature within an optimal range. The duration and number of the discharging pulses is selected to maximize the availability of ions, obtain a desired crystal size of material deposits on the plates and minimize the formation of sharp edges on the crystals. The duration of the waiting periods is varied so as to maximize the availability of ions.

U.S. Pat. No. 6,198,251 B1 to Landon shows battery charging wherein charging current is turned off and on periodically to allow gases formed during charging to recombine with the battery's electrolytic solution. Landon also teaches applying a short discharge pulse during the period of recombination to "clean up" newly deposited material at the battery plates. U.S. patent to Ayers et al. has a battery recharge method which first introduces stepped charge current to restore a majority of energy to a deeply discharged battery. Then low frequency charge and discharge currents interspersed with relaxation periods are used to complete restoration of energy to the battery. U.S. Pat. No. 6,137,804 to Oglesbee et al. discusses the calculation of relaxation periods for the charging process of a lithium-ion battery and suggests relaxation periods that are 30 to 300 seconds long. An article at *Journal of Power Sources* 102 (2001) 302-309 by Li et "The Effects of Pulse Charging on Cycling Characteristics of Commercial Lithium-ion Batteries," discusses charging of lithium-ion batteries wherein relaxation periods are interposed between charging periods.

SUMMARY OF THE INVENTION

During the development of a battery design, iterative changes to the design are made as the design is optimized. In order to minimize the time needed to achieve a final battery design, it is beneficial to test new or modified battery designs as quickly as possible. A key testable battery parameter is the total electrical energy which can be drawn from the battery. Our invention is a method to rapidly test that key parameter. Our method starts with a fully charged battery, which is discharged at a first rate until a selected cutoff potential is reached and then the battery is relaxed for a first relaxation period. The battery is then discharged at a second, lower rate lower rate until the cutoff potential is reached whereupon the battery undergoes a second relaxation period longer than the first. Our method continues with further discharges of the battery at successively lower rates with increasingly longer relaxation periods. Our method continues until the battery is substantially exhausted. The cumulative value of all of the discharges is taken as a tested capacity of the battery. Preferably, the relaxation periods lengthen successively by a factor which decreases. Optionally, the cutoff potentials decrease for each successive discharge, typically by half a volt or less. Cleanup charges having no substantial effect on the tested capacity can be used; these charges are sent to the battery during the relaxation periods in order to shorten these periods. Additionally, a low frequency, low amplitude AC current can be sent to the battery continuously during testing to facilitate mixing of electrolytic reagents.

DETAILED DESCRIPTION OF THE PREFERRED EMBODIMENT(S)

Definitions and Terminology

Figure 1:
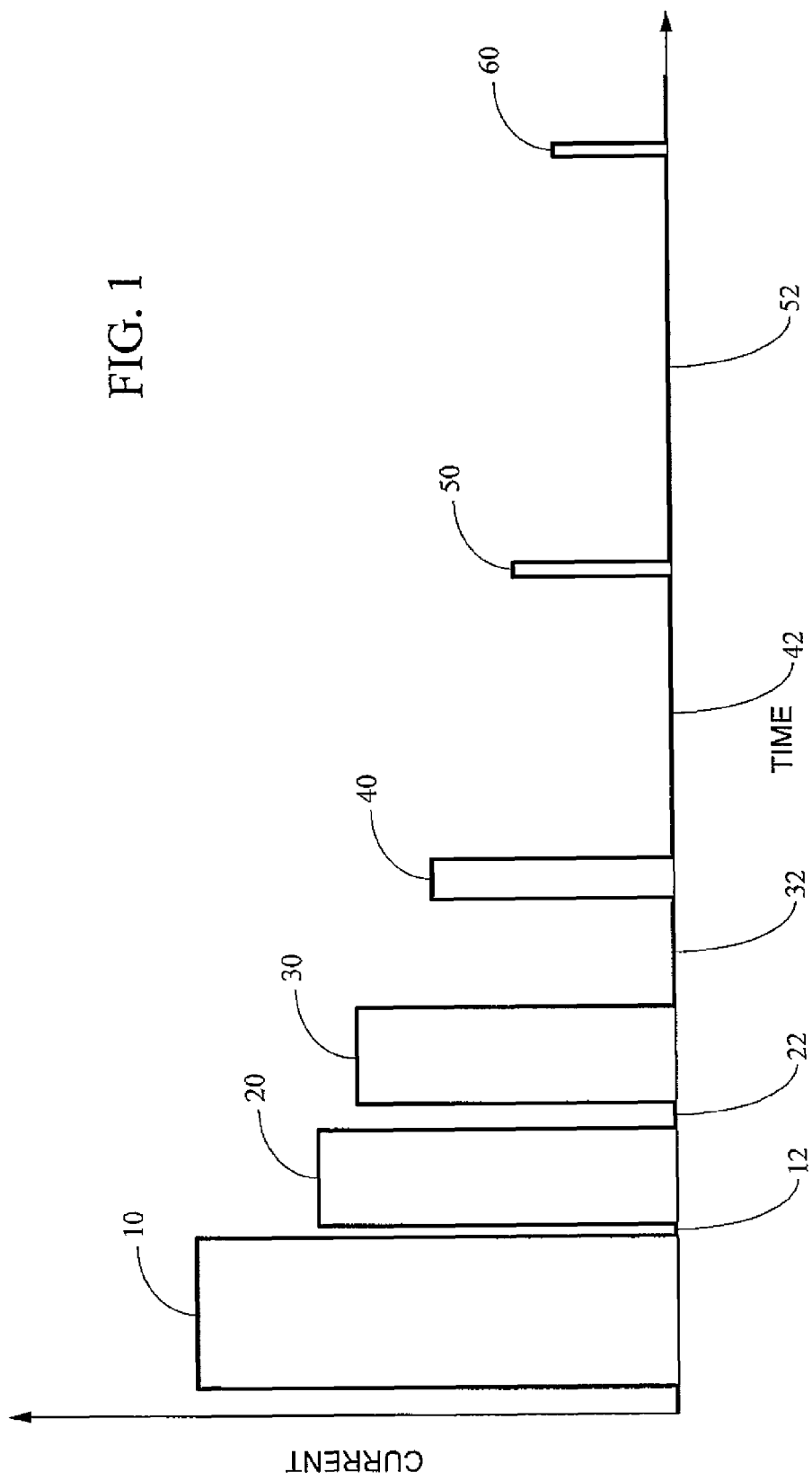
FIG. 1 is a current-time graph illustrating a battery discharge regimen in accordance with one embodiment of our technique to rapidly determine the capacity of a battery.

The following definitions and terminology are applied as understood by one skilled in the appropriate art.

The singular forms such as "a," "an," and "the" include plural references unless the context clearly indicates otherwise. For example, reference to "a material" includes reference to one or more of such materials, and "an element" includes reference to one or more of such elements.

As used herein, "substantial" and "about", when used in reference to a quantity or amount of a material, dimension, characteristic, parameter, and the like, refer to an amount that is sufficient to provide an effect that the material or characteristic was intended to provide as understood by one skilled in the art. The amount of variation generally depends on the specific implementation. Similarly, "substantially free of" or the like refers to the lack of an identified composition, characteristic, or property. Particularly, assemblies that are identified as being "substantially free of" are either completely absent of the characteristic, or the characteristic is present only in values which are small enough that no meaningful effect on the desired results is generated.

Concentrations, values, dimensions, amounts, and other quantitative data may be presented herein in a range format. One skilled in the art will understand that such range format is used for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 dimensional unit to about 100 dimensional units should be interpreted to include not only the explicitly recited limits, but also to include individual sizes such as 2 dimensional units, 3 dimensional units, 10 dimensional units, and the like; and sub-ranges such as 10 dimensional units to 50 dimensional units, 20 dimensional units to 100 dimensional units, and the like.

The value C herein is used to signify a charge or discharge rate equal to the capacity of a battery divided by one hour. Thus C for a 1600 milliamp battery would be 1.6 Amps. Because C is dependent on the capacity of a battery, the C value will differ for batteries of different capacity.

The first step of our technique is to recharge a battery to be tested with the manufacturer's recommended recharging method until the battery is fully recharged. Then the battery is allowed to reach balance for a certain period of time, generally between 1 second and 1 hour, but typically for a number of minutes, which varies for different battery chemistry. The time to remain in balance will generally be the same for batteries having the same chemical makeup. After the period of balance, the battery is rapidly discharged at a rate typically between 20C and 1C until a selected cutoff potential is reached. A battery relaxation period follows during which, in one embodiment of our technique, the battery is neither charged nor discharged. In other embodiments of our technique, a small charging pulse occurs in the relaxation periods or a small AC current is applied continuously during the test and thus occurs during the relaxation periods. After the relaxation period, the battery is discharged again but with a lower discharge rate than the first discharge until the cutoff potential is reached. Another battery relaxation period follows which is longer than the first relaxation period. This process of alternate discharges and relaxations is repeated with successively lower discharge rates, and successively longer relaxation periods. Optionally, the cutoff potential is decreased slightly, by 0.5 volts or less, between any two discharges or for each successive discharge. The battery capacity value after the final discharge is assumed to correspond to the cumulative capacity taken from the battery by all the discharges.

Normally no more than ten discharges are used since ten or fewer discharges suffice to obtain acceptably accurate battery capacity data, and further discharges take additional testing time, which our method seeks to save. Also, the battery is substantially exhausted (discharged such that essentially no further current can be drawn) after ten or fewer discharges performed in accordance with our method. In our method, substantial exhaustion enhances getting an accurate reading of the total capacity, or total available energy, of a given battery design. Such substantial exhaustion is not necessarily preferred in cases where the battery will undergo subsequent life cycle testing or where the intent of the test is to simulate conditions the battery will experience in normal use.

In one preferred mode, our method is an open loop process in that the method is independent of feedback data from the battery. That is, the discharges, relaxation periods, charge pulses and AC current are unaffected by changes in measurable battery parameters or conditions. This preferred mode simplifies the test procedure, avoids the need for feedback circuitry and facilitates procedural consistency when tests on multiple batteries of the same design are performed.

A first embodiment of our technique is discussed specifically with reference to FIG. 1 wherein a series battery discharges having successively lower discharge rates over time is shown. Discharges are represented by horizontal graph segments at reference numerals 10, 20, 30, 40, 50 and 60, where reference numeral 60 represents the final discharge. In between the discharges are successively longer relaxation periods represented by horizontal graph segments 12, 22, 32, 42, and 52. The discharge rates and relaxation periods will vary depending on the characteristics of the battery tested such as, for example, the battery chemistry, electrode design, battery size and battery voltage. A typical set of values for the discharge rates of a 12 volt lead acid battery tested by the technique associated with FIG. 1 is shown in the first column of Table 1. Table 1 represents actual test data. The rates 8C, 6C, 4C, 2C, 1C and C/3 in Table 1 are respectively at reference numerals, 10, 20, 30, 40, 50 and 60 in FIG. 1. A typical set of values for the rests or relaxation periods for a tested 12 volt battery is shown in the fourth column of Table 2. The times in minutes of ⅙, 1, 4, 10 and 20 30 are respectively at 12, 22 32, 42 and 52 of FIG. 1.

Successive relaxation periods preferably increase in a programmatic fashion. Typically the second rest period will be the same or several times as long as the first. Further relaxation periods lengthen successively by a factor which decreases, as shown and typified by the "Rest Increase Factor" column in Table 1. The set of rest increase factors can be varied, but it is contemplated that these factors will normally not vary by more than 50%. Thus, for example a rest increase factor of 6 in the second row, last column of Table 1 will normally be in the range from 3 to 9.

The tested battery capacity from of Table 1 is 89.42 Ah (Ampere hours), a value acceptably accurate for our purposes, as compared to 90.41 Ah for a reference test in which the same battery was discharged continuously at a C/5 rate.

For further evaluation of our method, the results from Table 1 were compared to a battery test wherein successively smaller discharges were applied between battery rest or relaxation periods of a constant length. The results of that comparative test are shown in Table 2, wherein a battery capacity of 76.17 was obtained for the same type battery as that used for the test of Table 1.

TABLE 1

Battery Discharge - Varied Rest Periods

| Rate | Cumulative Measured Capacity | Cut Off Voltage (V) | Rest (min.) | Rest increase Factor (from last rest) |
|---|---|---|---|---|
| 8C | 11.06 | 10.5 | 1/6 | |
| 6C | 24.92 | 10.5 | 1 | 6 |
| 4C | 35.92 | 10.5 | 4 | 4 |
| 2C | 50.85 | 10.5 | 10 | 2.5 |
| 1C | 66.22 | 10.5 | 20 | 2 |
| C/3 | 83.3 | 10.5 | 30 | 1.5 |
| C/5 | 89.42 | 10.5 | | |

TABLE 2

| Rate | Cumulative Measured Capacity (Ah) | Cutoff Voltage (V) | Rest (min.) |
|---|---|---|---|
| 8C | 10.15 | 10.5 | 5 |
| 6C | 27.41 | 10.5 | 5 |
| 4C | 39.35 | 10.5 | 5 |
| 2C | 52.45 | 10.5 | 5 |
| 1C | 59.36 | 10.5 | 5 |
| C/3 | 70.55 | 10.5 | 5 |
| C/5 | 76.17 | 10.5 | |

Figure 2:
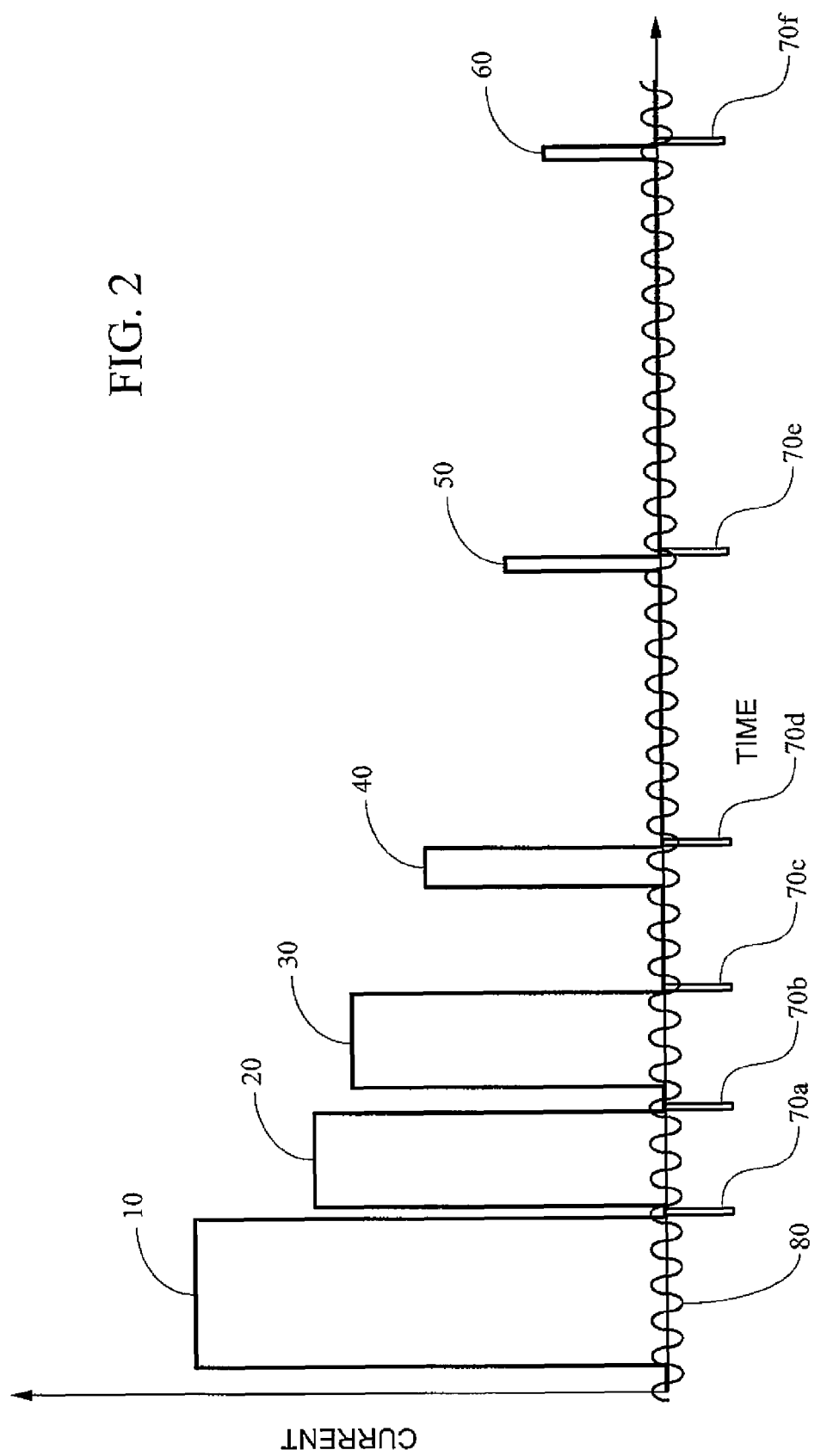
FIG. 2 is a current-time graph illustrating features of other battery discharge regimens in accordance with additional embodiments of our technique. Note that the AC current signal in FIG. 2 is shown with a disproportionately large amplitude and period for illustrative purposes.

As an option in our basic method discussed above, we introduce the added step of sending a small "clean up" charge back to the battery during each relaxation period. Clean up charges will assure that the relaxation period is sufficiently long and will allow shortening of relaxation periods. Clean up charges are represented in FIG. 2 at numerals 70a, 70b, 70c, 70d, 70e and 70f. The amplitude of the clean up charges 70a through 70e is preferably 10 to 15 percent of the initial discharge amplitude. For the test exemplified by Table 1, the clean up charge has an amplitude between 0.05C and 2 C. The duration of the clean up charges is generally preferred to be between 0.1 and 3.0 seconds. In any event the amplitude and duration of the clean up charge is large enough that substantially all negative ions will be driven from contact with the positive plate of the battery and substantially all positive ions will be driven from the negative plate. The amplitude and duration of the clean up charges is small enough that is has substantially no effect on the results of a battery capacity test.

In the alternative to or in addition to the clean up charges, our method of battery capacity testing can include the use of a small bipolar wave form continuously during the test. Application of this wave form enhances the mixing or homogenization of electrolytic reagents at or near the positive and negative plates of the battery. The bipolar wave form preferably takes the form of a low frequency AC current wherein the frequency is most conveniently in the 50 to 60 Hz range and preferably is less than 200 Hz. The continuous bipolar wave form is represented as an AC current at reference numeral 80 in FIG. 2, the periods and amplitude of the AC current being exaggerated in FIG. 2 for purposes of illustration. The preferred amplitude for AC current 80 is between 0.1% and 1.0% of the initial discharge current.

Various alterations and modifications will become apparent to those skilled in the art without departing from the scope and spirit of this invention and it is understood this invention is limited only by the following claims.

What is claimed is:

1. A method of testing the discharge capacity of a battery comprising the steps of:
    discharging the battery at a first discharge rate until a first cutoff potential of the battery is reached;
    allowing the battery to relax during a first relaxation period;
    discharging the battery at a second discharge rate lower than the first rate until a second cutoff potential of the battery is reached;
    allowing the battery to relax during a second relaxation period the same or longer than the first relaxation period;
    discharging the battery at a third discharge rate lower than the second rate until a third cutoff potential is reached;
    allowing the battery to relax during a third relaxation period the same or longer than the second relaxation period;
    and continuing with further discharges of the battery at successively lower discharge rates with at least some increasingly longer relaxation periods following the further discharges until the battery is substantially exhausted;
    wherein a cumulative value of all of the discharges is taken as a tested capacity of the battery.

2. The method of claim 1, wherein the relaxation periods lengthen successively by a factor which decreases.

3. The method of claim 2, wherein the second relaxation period is several times as long as the first relaxation period.

4. The method of claim 2 wherein a charge pulse is sent to the battery during at least one of the relaxation periods.

5. The method of claim 4 wherein the charge pulse is a cleanup charge having substantially no effect on the tested capacity of the battery.

6. The method of claim 4 wherein amplitude of the charge pulse is between 10 and 15 percent of the amplitude of the first discharge pulse.

7. A method of rapidly testing the discharge capacity of a battery comprising the steps of:
    charging the battery to full capacity;
    discharging the battery at a first rate until a first cutoff potential of the battery is reached;
    allowing the battery to relax during a first relaxation period;
    discharging the battery at a second rate lower than the first rate until a second cutoff potential of the battery is reached,
    allowing the battery to relax during a second relaxation period longer than the first relaxation period;
    discharging the battery at a third rate lower than the second rate until a third cutoff potential is reached;
    allowing the battery to relax during a third relaxation period longer than the second relaxation period;
    and continuing with further discharges of the battery at successively lower rates with increasingly longer relaxation periods following the further discharges until the battery is substantially exhausted;
    supplying a bipolar waveform current to the battery continuously during testing of the battery;
    wherein a cumulative value of all of the discharges is taken as a tested capacity of the battery.

8. The method of claim 7, wherein the bipolar waveform current is an AC current having a frequency of no more than 200 Hz.

9. The method of claim 7 wherein amplitude of the AC current between 0.1% and 1.0% of the amplitude of a current for the first discharge rate.

10. A method of testing the discharge capacity of a battery comprising the steps of:
- charging the battery to full capacity;
- discharging the battery at a first discharge rate until a first cutoff potential of the battery is reached;
- allowing the battery to relax during a first relaxation period;
- discharging the battery at a second discharge rate lower than the first rate until a second cutoff potential of the battery is reached, the second cutoff potential being lower than the first cutoff potential;
- allowing the battery to relax during a second relaxation period longer than the first relaxation period;
- discharging the battery at a third discharge rate lower than the second rate until a third cutoff potential is reached, the third cutoff potential being lower than the second cutoff potential;
- allowing the battery to relax during a third relaxation period longer than the second relaxation period;
- and continuing with further discharges of the battery at successively lower discharge rates until reaching successively lower cutoff potentials with increasingly longer relaxation periods following the further discharges, the further discharges being continued until the battery is substantially exhausted;
- wherein a cumulative value of all of the discharges is taken as a tested capacity of the battery; and
- wherein the method follows an open loop test procedure.

11. The method of claim 10, wherein the relaxation periods lengthen successively by a factor which decreases.

12. The method of claim 11, wherein cleanup charges are sent to the battery during the relaxation periods and wherein the cleanup charges have substantially no effect on the tested capacity of the battery.

13. The method of claim 12, further including supplying a bipolar waveform current to the battery continuously during testing of the battery.

14. The method of claim 12, wherein the bipolar waveform current is an AC current having a frequency of no more than 200 Hz and the AC current amplitude is between 0.1% and 1.0% of a current value for the first discharge rate.

15. The method of claim 14, wherein the AC current has a frequency of about 50 to 60 Hz.

* * * * *